United States Patent
VanGilder et al.

(10) Patent No.: US 9,904,331 B2
(45) Date of Patent: Feb. 27, 2018

(54) METHOD FOR COMPUTING COOLING REDUNDANCY AT THE RACK LEVEL

(75) Inventors: James W. VanGilder, Pepperell, MA (US); Christopher M. Healey, Atlanta, GA (US)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 645 days.

(21) Appl. No.: 12/416,567

(22) Filed: Apr. 1, 2009

(65) Prior Publication Data

US 2010/0256959 A1    Oct. 7, 2010

(51) Int. Cl.
G06G 7/48      (2006.01)
G06F 1/20      (2006.01)
H05K 7/20      (2006.01)

(52) U.S. Cl.
CPC .......... *G06F 1/20* (2013.01); *H05K 7/20836* (2013.01)

(58) Field of Classification Search
USPC ........................................................... 703/6
See application file for complete search history.

(56) References Cited

U.S. PATENT DOCUMENTS

| | | | |
|---|---|---|---|
| 5,462,225 A | 10/1995 | Massara et al. | |
| 5,581,478 A | 12/1996 | Cruse et al. | |
| 5,586,250 A * | 12/1996 | Carbonneau | G06F 3/0607 714/44 |
| 5,657,641 A | 8/1997 | Cunningham et al. | |
| 5,682,949 A | 11/1997 | Ratcliffe et al. | |
| 5,850,539 A | 12/1998 | Cook et al. | |
| 5,995,729 A | 11/1999 | Hirosawa et al. | |
| 6,134,511 A | 10/2000 | Subbarao | |
| 6,191,500 B1 | 2/2001 | Toy | |
| 6,216,956 B1 | 4/2001 | Ehlers et al. | |
| 6,246,969 B1 | 6/2001 | Sinclair et al. | |
| 6,347,627 B1 | 2/2002 | Frankie et al. | |
| 6,374,627 B1 | 4/2002 | Schumacher et al. | |
| 6,459,579 B1 | 10/2002 | Farmer et al. | |
| 6,557,624 B1 | 5/2003 | Stahl et al. | |
| 6,574,104 B2 | 6/2003 | Patel et al. | |
| 6,672,955 B2 | 1/2004 | Charron | |

(Continued)

FOREIGN PATENT DOCUMENTS

| | | |
|---|---|---|
| WO | 2005081091 A2 | 9/2005 |
| WO | 2006/034718 A1 | 4/2006 |
| WO | 2010068434 A1 | 6/2010 |

OTHER PUBLICATIONS

Lennox, Cubic Feet Per Minute (CFM), 2017, Lennox, pp. 1-2.*

(Continued)

*Primary Examiner* — Omar Fernandez Rivas
*Assistant Examiner* — Bernard E Cothran
(74) *Attorney, Agent, or Firm* — Lando & Anastasi, LP

(57) ABSTRACT

A system and method for designing aspects of a cooling system for a data center is provided. A method is provided including computing cooling redundancy at each rack position in a data center, in real time. The redundancy can be reported using the traditional N+1, N+2, etc. notation, where N is the number of coolers required to meet the primary cooling load type specification. The redundancy can also be reported in terms of a Cooling Reliability Index (CRI) which also takes into account the inherent availability of the specific cooling units in the design.

21 Claims, 6 Drawing Sheets

(56) References Cited

U.S. PATENT DOCUMENTS

| | | |
|---|---|---|
| 6,694,759 B1 | 2/2004 | Bash et al. |
| 6,714,977 B1 | 3/2004 | Fowler et al. |
| 6,718,277 B2 | 4/2004 | Sharma |
| 6,721,672 B2 | 4/2004 | Spitaels et al. |
| 6,745,579 B2 | 6/2004 | Spinazzola et al. |
| 6,804,616 B2 | 10/2004 | Bodas |
| 6,819,563 B1 | 11/2004 | Chu et al. |
| 6,859,366 B2 | 2/2005 | Fink |
| 6,862,179 B2 | 3/2005 | Beitelmal et al. |
| 6,886,353 B2 | 5/2005 | Patel et al. |
| 6,967,283 B2 | 11/2005 | Rasmussen et al. |
| 7,020,586 B2 | 3/2006 | Snevely |
| 7,031,870 B2 | 4/2006 | Sharma et al. |
| 7,046,514 B2 | 5/2006 | Fink et al. |
| 7,051,946 B2 | 5/2006 | Bash et al. |
| 7,085,133 B2 | 8/2006 | Hall |
| 7,155,318 B2 | 12/2006 | Sharma et al. |
| 7,197,433 B2 | 3/2007 | Patel et al. |
| 7,236,363 B2 | 6/2007 | Belady |
| 7,251,547 B2 | 7/2007 | Bash et al. |
| 7,313,503 B2 | 12/2007 | Nakagawa et al. |
| 7,315,448 B1 | 1/2008 | Bash et al. |
| 7,403,391 B2 | 7/2008 | Germagian et al. |
| 7,426,453 B2 | 9/2008 | Patel et al. |
| 7,462,453 B2 | 12/2008 | Yamada et al. |
| 7,472,043 B1 | 12/2008 | Low et al. |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,620,480 B2 | 11/2009 | Patel et al. |
| 7,676,280 B1 | 3/2010 | Bash et al. |
| 7,726,144 B2 | 6/2010 | Larson et al. |
| 7,844,440 B2 | 11/2010 | Nasle et al. |
| 7,881,910 B2 | 2/2011 | Rasmussen et al. |
| 7,885,795 B2 | 2/2011 | Rasmussen et al. |
| 7,908,126 B2 | 3/2011 | Bahel et al. |
| 7,975,156 B2 | 7/2011 | Artman et al. |
| 7,979,250 B2 | 7/2011 | Archibald et al. |
| 8,155,922 B2 | 4/2012 | Loucks |
| 8,228,046 B2 | 7/2012 | Ingemi et al. |
| 8,244,502 B2 | 8/2012 | Hamann et al. |
| 8,425,287 B2 | 4/2013 | Wexler |
| 8,473,265 B2 | 6/2013 | Hlasny et al. |
| 8,509,959 B2 | 8/2013 | Zhang et al. |
| 2001/0042616 A1 | 11/2001 | Baer |
| 2002/0059804 A1 | 5/2002 | Spinazzola et al. |
| 2003/0115000 A1 | 6/2003 | Bodas |
| 2003/0115024 A1 | 6/2003 | Snevely |
| 2003/0158718 A1 | 8/2003 | Nakagawa et al. |
| 2004/0020224 A1 | 2/2004 | Bash et al. |
| 2004/0065097 A1 | 4/2004 | Bash et al. |
| 2004/0065104 A1 | 4/2004 | Bash et al. |
| 2004/0075984 A1 | 4/2004 | Bash et al. |
| 2004/0083012 A1 | 4/2004 | Miller |
| 2004/0089009 A1 | 5/2004 | Bash et al. |
| 2004/0089011 A1 | 5/2004 | Patel et al. |
| 2004/0163001 A1 | 8/2004 | Bodas |
| 2004/0240514 A1 | 12/2004 | Bash et al. |
| 2004/0262409 A1* | 12/2004 | Crippen et al. ............... 236/49.3 |
| 2005/0023363 A1 | 2/2005 | Sharma et al. |
| 2005/0225936 A1 | 10/2005 | Day |
| 2005/0267639 A1 | 12/2005 | Sharma et al. |
| 2006/0080001 A1 | 4/2006 | Bash et al. |
| 2006/0112286 A1 | 5/2006 | Whalley et al. |
| 2006/0121421 A1 | 6/2006 | Spitaels et al. |
| 2006/0139877 A1 | 6/2006 | Germagian et al. |
| 2006/0214014 A1 | 9/2006 | Bash et al. |
| 2007/0038414 A1 | 2/2007 | Rasmussen et al. |
| 2007/0078635 A1 | 4/2007 | Rasmussen et al. |
| 2007/0150215 A1 | 6/2007 | Spitaels et al. |
| 2007/0174024 A1 | 7/2007 | Rasmussen et al. |
| 2007/0213000 A1 | 9/2007 | Day |
| 2008/0041076 A1 | 2/2008 | Tutunoglu et al. |
| 2008/0105412 A1 | 5/2008 | Carlsen et al. |
| 2008/0174954 A1 | 7/2008 | VanGilder et al. |
| 2008/0198549 A1 | 8/2008 | Rasmussen et al. |
| 2008/0245083 A1 | 10/2008 | Tutunoglu et al. |
| 2009/0030554 A1 | 1/2009 | Bean, Jr. et al. |
| 2009/0138313 A1 | 5/2009 | Morgan et al. |
| 2009/0138888 A1 | 5/2009 | Shah et al. |
| 2009/0150123 A1 | 6/2009 | Archibald et al. |
| 2009/0210097 A1 | 8/2009 | Sawczak et al. |
| 2009/0223234 A1 | 9/2009 | Campbell et al. |
| 2009/0259343 A1 | 10/2009 | Rasmussen et al. |
| 2009/0309570 A1 | 12/2009 | Lehmann et al. |
| 2009/0326879 A1 | 12/2009 | Hamann et al. |
| 2010/0256959 A1 | 10/2010 | VanGilder et al. |
| 2010/0286956 A1 | 11/2010 | VanGilder et al. |
| 2011/0213508 A1 | 9/2011 | Mandagere et al. |
| 2012/0221872 A1 | 8/2012 | Artman et al. |

OTHER PUBLICATIONS

N. Rasmussen, "Cooling Strategies for Ultra-High Density Racks and Blade Servers", White Paper #46, pp. 1-14, American Power Conversion, Mar. 29, 2005, published on World Wide Web.

N. Rasmussen, "Strategies for Deploying Blade Servers in Existing Data Centers", White Paper #125, pp. 1-14, American Power Conversion, Mar. 29, 2005, published on World Wide Web.

K. Dunlap, "Cooling Audit for Identifying Potential Cooling Problems in Data Centers", White Paper #40, pp. 1-18, American Power Conversion, May 20, 2004, published on World Wide Web.

N. Rasmussen, "Calculating Total Cooling Requirements for Data Centers", White Paper #25, pp. 1-8, American Power Conversion, May 20, 2004, published on World Wide Web.

"Management Strategy for Network Critical Physical Infrastructure", White Paper #100, pp. 1-10, American Power Conversion, Dec. 15, 2003, published on World Wide Web.

Innovative Research, Inc., http://web.archive.org/web/20050405003224/http://www.inres.com/, Apr. 5, 2005, published on World Wide Web.

Ashrae, "Thermal Guidelines for Data Processing Environments" Atlanta: American Society of Heating, Refrigerating, and Air-Conditioning Engineers, Inc., Atlanta, 2004.

Bash, C.E., Patel, C.D., and Sharma, R.K., "Efficient Thermal Management of Data Centers—Immediate and Long-Term Research Needs" Int'l. J. Heat, Ventilating, Air-Conditioning and Refrigeration Research, pp. 137-152, vol. 9, No. 2, 2003.

Herrlin, M.K., "Rack Cooling Effectiveness in Data Centers and Telecom Central Offices: The Rack Cooling Index (RCI)," ASHRAE Transaction, vol. 111(2), 2005.

Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002, St. Louis, Missouri.

Dvinsky, A. "Hot Tips for Using Cooling Software, A Little Planning Lets Users Get More from Their Thermal-Simulation Software," Machine Design, vol. 72, No. 4, pp. 80-86, XP-001198563, Feb. 24, 2000.

"Essential Cooling System Requirements for Next Generation Data Centers," White Paper #5, Revision 3, 2003 American Power Conversion, Rev 2002-3, pp. 1-10.

"How and Why Mission-Critical Cooling Systems Differ From Common Air Conditions," White Paper #56, Revision 2, 2003 American Power Conversion, Rev 2003-2, pp. 1-13.

Abdlmonem H. Beitelmal et al.: "Thermo-Fluids Provisioning of a High Performance High Density Data Center" Distributed and Parallel Databases, Kluwer Academic Publishers, BO, vol. 21, No. 2-3, Apr. 22, 2006, pp. 227-238, XP019499843, ISSN: 1573-7578.

Ahmad, Jasim U. et al., "Navier-Stokes simulation of air-conditioning facility of a large modern computer room," 2005, Proceedings of the 2005 ASME Fluids Engineering Division Summer Meeting and Exhibition, pp. 1-6.

APC User's Guide Brochure, "InfraStruXure Manager," Mar. 2004, 181 pgs.

Bash, C. E et al.: "Balance of Power: Dynamic Thermal Management for Internet Data Centers", IEEE Internet Computing , Jan. 1, 2005, pp. 42-49, vol. 9, No. 1, IEEE Service Center, New York, NY.

(56) References Cited

OTHER PUBLICATIONS

Chandrakant D. Patel, et al., "Thermal Considerations in Cooling Large Scale High Copute Density Data Centers" IEEE 2002, pp. 767-776.

Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.

Ehsan Pakabaznia et al., "Minninizing data center cooling and server power costs", Proceedings of the 14th ACM/IEEE International Symposium on Low Power Electronics and Design, ISLPED '09, Jan. 1, 2009 (Jan. 1, 2009), p. 145, XP55015368, New York, New York, USA, DOI: 10.1145/1594233.1594268, ISBN: 978-1-60-558684-7.

International Search Report and Written Opinion for corresponding PCT/US2011/066089 dated Mar. 19, 2012.

International Search Report for PCT/US2006/16739 dated Oct. 3, 2006.

International Search Report for PCT/US2008/051908 dated Jul. 3, 2008.

VanGilder, James, W., et al., "Real-time prediction of rack-cooling performance," 2006, ASHRAE Transactions, vol. 112, pp. 151-162.

VanGlider, James, W., et al., "Capture index: an airflow-based rack cooling performance metric," 2007, ASHRAE Transactions, vol. 113, pp. 126-136.

CN201080014511.9, Chinese First Office Action, dated May 10, 2013.

"Optimizing facility operation in high density data center environments," 2007, Hewlett-Packard Development Company, pp. 1-25.

Bemis et al, Data Center Airflow Modeling: Helps Facilities Planners Make Informed Decisions. Applied Math Modeling Inc. 2009 [retrieved on Apr. 19, 2012]. Retrieved from the Internet: <URL: http://www.coolsimsoftware.com/wwwrooULinkCiick. aspx?fileticket=r1 SqFUDtRTk%3D&tabid=189> entire document.

Donald L. Beaty et al., "High Density Cooling of Data Centers and Telecom Facilities—Part 2," 2005, ASHRAE Transactions, vol. 111, pp. 932-944.

James W. VanGilder et al., "Partially decoupled aisle method for estimating rack-cooling performance in near-real time," 2007, Proceedings of the IPACK2007 ASME InterPACK07, pp. 781-789.

Roger R. Schmidt et al., "Best practices for data center thermal and energy management—review of literature," ASHRAE Transactions, vol. 112, pp. 206-218 [2007].

S.L Sinha, R.C Arora, Subhransu Roy, Numerical simulation of two-dimensional room air flow with and without buoyancy, Energy and Buildings, vol. 32, Issue 1, Jun. 2000, pp. 121-129.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s1 0619-005-0413-0.

\* cited by examiner

| | | | |
|---|---|---|---|
| 1 | 1 | 1 | 1 |
| 0 | 1 | 1 | 1 |
| 1 | 0 | 1 | 1 |
| 1 | 1 | 0 | 1 |
| 1 | 1 | 1 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 0 | 0 | 0 | 1 |
| 0 | 0 | 1 | 0 |
| 0 | 1 | 0 | 0 |
| 1 | 0 | 0 | 0 |
| 0 | 0 | 0 | 0 |

FIG. 8

METHOD FOR COMPUTING COOLING REDUNDANCY AT THE RACK LEVEL

BACKGROUND OF INVENTION

Field of the Invention

At least one embodiment in accord with the present invention relates generally to systems and methods for data center management, and more specifically, to systems and methods for managing data center cooling.

Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these connectivity, power and cooling elements. In some data center configurations, these racks are organized into rows and clusters having hot and cold aisles to decrease the cost associated with cooling the information technology equipment. These characteristics make data centers a cost effective way to deliver the computing power required by many software applications.

Various processes and software applications, such as the InfrastruXure® Central product available from American Power Conversion Corporation (APC) of West Kingston, R.I., have been developed to aid data center personnel in designing and maintaining efficient and effective of data centers configurations. These tools often guide data center personnel through activities such as designing the data center structure, positioning equipment within the data center prior to installation and adding, repositioning, or removing equipment after construction and installation are complete. Thus, conventional tool sets provide data center personnel with a standardized and predictable design methodology.

Because of local variations in the delivery of cool air to racks and/or the capture of hot rack exhaust air from racks, even after careful design using such tools it is almost always the case that some rack locations have either too much or too little cooling. This is not only the case for primary (non-failure-mode) cooling but for various cooling-failure modes as well. To compensate for this rack-to-rack variation in (primary and failure-mode) cooling, a facility is often over designed—often by a large margin as the consequences of downtime are severe. This over-provisioning of (primary and failure-mode) cooling equipment results in excessive capital and operating costs.

SUMMARY OF THE INVENTION

Aspects of embodiments of the invention provide methods for computing cooling redundancy at each rack position in a data center, in real time. The redundancy can be reported using the traditional N+1, N+2, etc. notation, where N is the number of coolers required to meet the primary cooling load type specification. The redundancy can also be reported in terms of a Cooling Reliability Index (CRI) which also takes into account the inherent availability of the specific cooling units in the design.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 8 depicts a sequence of vectors representing coolers which are operating and coolers which are not operating, according to a coding embodiment.

DETAILED DESCRIPTION

Figure 1:
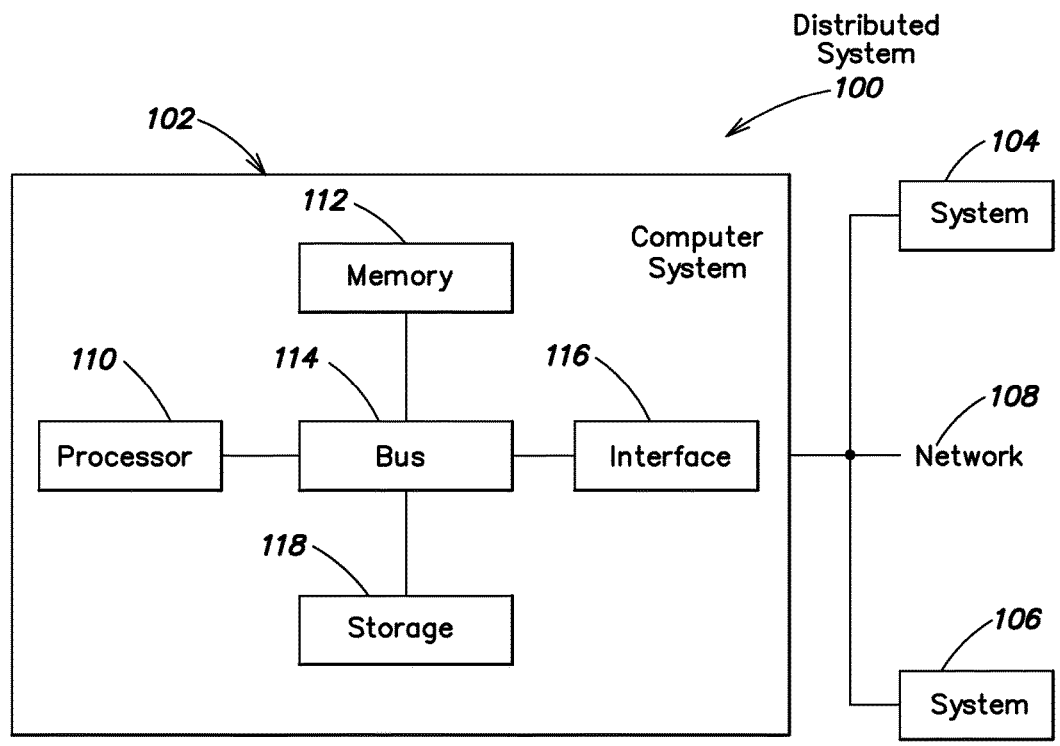
FIG. 1 shows an example computer system with which various aspects in accord with the present invention may be implemented.

At least some embodiments in accord with the present invention relate to systems and processes through which a user may design data center configurations. These systems may facilitate this design activity by allowing the user to assess data center cooling redundancy at various levels of granularity, including cluster, row and rack levels.

Design tools such as Computational Fluid Dynamics (CFD) and real-time cooling calculators incorporated in conventional tools offered by APC facilitate the proper matching of rack-by-rack IT load with primary cooling requirements; however, presently, there are no tools which, as described below, automate the process of determining the cooling available to each rack under various cooling failure scenarios. The data center designer or operator benefits from a design tool incorporating aspects of embodiments, and therefore which not only indicates the primary cooling performance at each rack location but also the redundancy at each rack location.

Presently, there is no concept of cooling redundancy at the rack level despite the obvious variations in cooling-failure-mode performance from one location to another in a data center. For example, consider a cluster of racks and row-based coolers in which several coolers are located near the left end of the cluster and another, single cooler is located near the right end of the cluster. The failure of a single cooler at the left end will likely have no effect on cooling performance for racks near the left end as multiple coolers in the area will continue to function; however, a failure of the single cooler at the right end will likely result in insufficient cooling for racks near the right end of the cluster as there are no other coolers in the area to cover the load.

In some embodiments, models may include structural components of a data center, such as, among other structural components, walls, ceilings, floors and the spaces defined by these structural components. The model may also include representations of data center equipment, such as, among other equipment, cooling consumers and cooling providers, located within the model space. Cooling providers may be any element of the data center that is involved in the generation or distribution of cool air to other data center equipment. Examples of cooling providers include, among others, computer room air conditioners (CRACs), computer room air handlers (CRAHs) and tiles located in the floor or ceiling. Cooling consumers include any element of the data center that consumes the cooling supply generated by the cooling providers. Examples of cooling consumers include, among others, network devices, servers and other information technology equipment. In a data center, these cooling consumers may be mounted in racks, although this is not a requirement. In at least one embodiment, the model may calculate and display cooling performance information, such as cooling metrics, through representations of data center equipment. Further, in at least one embodiment, the model may calculate and display redundancy information, such as a number of cooling equipment failures tolerated at each rack or a Cooling Reliability Index (CRI).

The aspects disclosed herein, which are in accord with the present invention, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. However, such a system may also perform other functions, such as suggesting changes to data center configurations, based on, for example, industry best practices. Moreover, the systems described herein may be configured to include or exclude any of the functions discussed herein. Thus the invention is not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accord with the present invention may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accord with the present invention may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accord with the present invention may be implemented within methods, acts, systems, system elements and components using a variety of hardware and software configurations; the invention is not limited to any particular distributed architecture, network, or communication protocol.

FIG. 1 shows a block diagram of a distributed computer system 100, in which various aspects and functions in accord with the present invention may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, ethernet, wireless ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TSL, SSL or VPN among other security techniques. While distributed computer system 100 illustrates three networked computer systems, distributed computer system 100 may include any number of computer systems and computing devices, networked using any medium and communication protocol.

Various aspects and functions in accord with the present invention may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile storage device. Various embodiments in accord with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI and InfiniBand. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable nonvolatile storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then copies the data to the medium associated with storage system 118 after processing is completed. A variety of components may manage data movement between the medium and integrated circuit memory element and the invention is not limited thereto. Further, the invention is not limited to a particular memory system or storage system.

Although computer system 102 is shown by way of example as one type of computer system upon which various aspects and functions in accord with the present invention may be practiced, aspects of the invention are not limited to being implemented on the computer system as shown in FIG. 1. Various aspects and functions in accord with the present invention may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and embodiments are not limited to any particular implementation.

The processor and operating system together define a computer platform for which application programs in high-level programming languages may be written. These component applications may be executable, intermediate, for example, C–, bytecode or interpreted code which communicates over a communication network, for example, the Internet, using a communication protocol, for example, TCP/IP. Similarly, aspects in accord with the present invention may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accord with the present invention may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the invention is not limited to a specific programming language and any suitable programming language could also be used.

A computer system included within an embodiment may perform functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of Uppsala, Sweden or integration software such as Web Sphere middleware from IBM of Armonk, N.Y. However, a computer system running, for example, SQL Server may be able to support both aspects in accord with the present invention and databases for sundry applications not within the scope of the invention.

Example System Architecture

Figure 2:
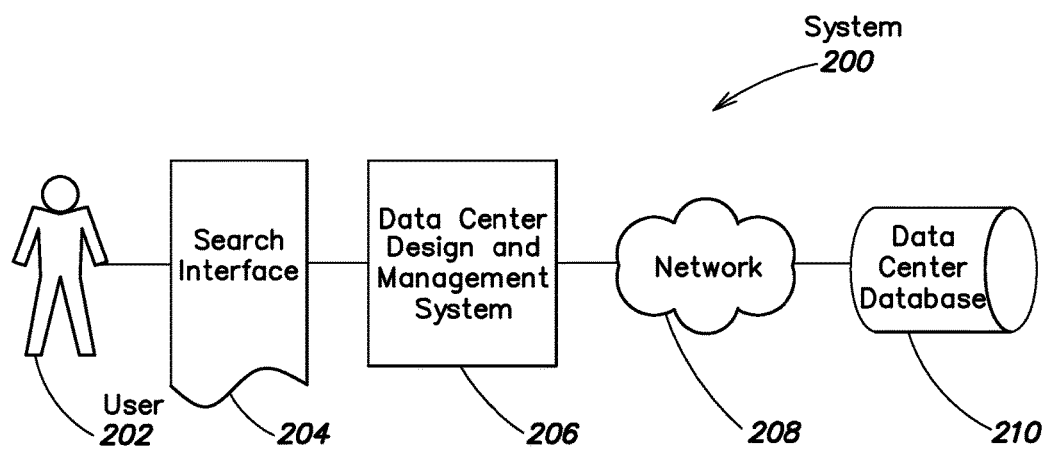
FIG. 2 illustrates an example distributed system including an embodiment.

FIG. 2 presents a context diagram including physical and logical elements of distributed system 200. As shown, distributed system 200 is specially configured in accord of the present invention. The system structure and content recited with regard to FIG. 2 is for exemplary purposes only and is not intended to limit the invention to the specific structure shown in FIG. 2. As will be apparent to one of ordinary skill in the art, many variant system structures can be architected without deviating from the scope of the present invention. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the invention.

Referring to FIG. 2, system 200 includes user 202, design interface 204, data center design and management system 206, communications network 208 and data center database 210. System 200 may allow user 202, such as a data center architect or other data center personnel, to interact with design interface 204 to create or modify a model of one or more data center configurations. According to one embodiment, design interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, design interface 204 may be implemented with specialized facilities that enable user 202 to design, in a drag and drop fashion, a model that includes a representation of the physical layout of a data center or any subset thereof. This layout may include representations of data center structural components as well as data center equipment. The features of design interface 204, as may be found in various embodiments in accord with the present invention, are discussed further below.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information required to support the features and functions of data center design and management system 206. For example, in one embodiment, data center database 210 may include at least some portion of the data stored in the data center equipment database described in PCT/US08/63675. In another embodiment, this information may include any information required to support design interface 204, such as, among other data, the physical layout of one or more data center model configurations, the production and distribution characteristics of the cooling providers included in the model configurations, the consumption characteristics of the cooling consumers in the model configurations and one or more cooling metrics characterizing the amount of cool air produced by the cooling providers that is lost prior to being consumed by the cooling consumers.

In at least one embodiment, data center database 210 may store, as part of the physical layout of a data center model configuration, the location and characteristics of the tiles that make up surfaces of the data center, such as the floor, ceiling and walls, of a model space. In at least one embodiment, the tiles may be floor tiles that are part of a raised floor, while in another embodiment the tiles may be ceiling tiles that are part of a drop ceiling. The characteristics of the tiles stored in data center database 210 may include, among other characteristics, whether or not the tiles are perforated, the size of the tiles and cooling metrics associated with the tiles, such as, in the example of a perforated tile, the airflow rate and temperature of air passing through it. As used herein, the term "perforated tile" may include any surface designed to allow airflow to pass through its boundary. Examples of perforated tiles include, among others standard-sized perforated tiles, custom-sized perforated tiles, cover grills and open holes. In some embodiments, this information is useful for providing enhanced functionality through design interface 204.

In another embodiment, data center database 210 may store, as a portion of the production and distribution characteristics of the cooling providers, the type of cooling provider, the amount of cool air provided by the cooling provider, and a temperature of cool air provided by the cooling provider. Thus, for example, data center database 210 includes record of a particular type of CRAC unit that is rated to deliver airflow at the rate of 5,600 cfm at a temperature of 68 degrees Fahrenheit. In addition, the data center database 210 may store one or more cooling metrics, such as an airflow leakage rate of an air plenum, such as a raised floor or a drop ceiling.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, the invention is not limited to a specific number of users or systems.

Design Interface Embodiments

According to various embodiments, design interface 204 may provide users with a high degree of flexibility regarding how and when they design data center cooling systems. In these embodiments, the user may design the entire cooling system in advance of the remainder of the data center configuration, may design the cooling system concurrently with other attributes of the data center or may design the cooling system after other parts of the data center design are complete. Thus, design interface 204 may be used to design new data centers or may be used to modify the designs of existing data centers. The formulation of useful systems and methods for conducting these design activities is impacted by the unique manner in which design interface 204 may be structured and organized. Conversely, the elements used and acts performed in these design activities impact the attributes and facilities of this embodiment of design interface 204.

Figure 3:
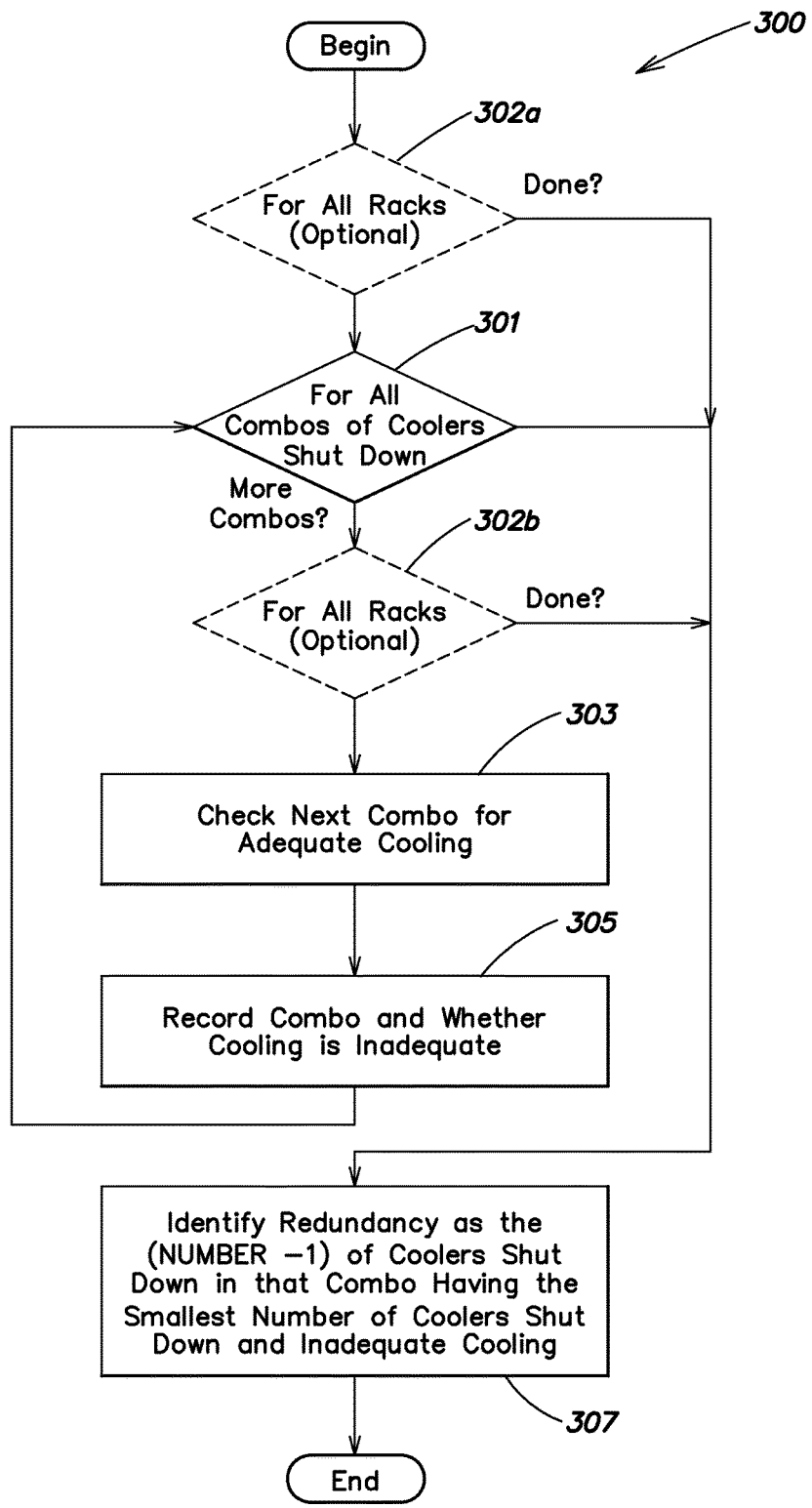
FIG. 3 illustrates an example process for designing a data center configuration according to an embodiment.

Design interface 204 may provide functionality through a variety of user interface screens and elements. FIG. 3 illustrates an example of a user interface 300 that may be included in design interface 204 according to some embodiments. As shown, user interface 300 includes many of the user interface elements discussed in PCT/US08/63675 with regard to the floor editor and the rack editor. These elements may function within this embodiment as they function with the floor editor and the rack editor disclosed within PCT/US08/63675.

In the context of this design interface, an embodiment provides features for computing and ensuring cooling redundancy at specific rack locations. Conventionally, there is no concept of cooling redundancy at a specific rack location. A single redundancy level is conventionally stated for an entire facility. In some cases, some racks in a facility will have sufficient redundancy while others will not. Other facilities may be so over-designed to ensure cooling redundancy at all locations that substantial capital and ongoing energy costs are wasted. The exemplary embodiment provides a method by which redundancy can be computed for each rack location in a new or existing facility. With this information, data center designers and operators can make fact-based business decisions related to IT uptime and expenditures. For example, the designer of a new facility can minimize the number of coolers to just satisfy the level of redundancy required—which may be potentially different in different areas of the data center—thereby avoiding costs associated with over-provisioning. As another example, a data center operator may use the method to determine where to install a new server so that the cooling redundancy requirements of the new server will be met and that the cooling redundancy of other nearby IT equipment will not be adversely affected by the installation.

In accordance with further aspects and embodiments, a Cooling Reliability Index (CRI) can be computed in addition to or in lieu of the traditional N+1-style redundancy specification. The CRI takes into account the inherent reliability characteristics (e.g. MTBF, MTTR) of the cooling equipment and can be used to estimate the actual fraction of time that adequate cooling is available at each rack location.

Computing N+1 Redundancy at Rack Level

Redundancy calculations for clusters of racks and coolers, based on N+1-style calculations, can be implemented within any suitable data center design tool. In the illustrative embodiment, the Capture Index (CI), an index described in detail in pending U.S. patent application Ser. No. 11/342,300, filed Jan. 27, 2006, published as document 2007-0038414 A1 on Feb. 15, 2007, incorporated herein by reference. In summary, the CI represents either the percentage of exhaust air from a location of concern within a data center that is "captured" by a cooler for that location (for a hot-aisle location where air is exhausted from the locations to the aisle) or the percentage of cooled air from a cooler that is "captured" by one or more locations of concern within the data center (for cool-aisle locations where air is received at the locations from the aisle). For the purpose of this exemplary embodiment, the CI serves as the cooling performance metric although other metrics, like rack inlet temperature, can be used.

Using real-time, CI-based cooling calculators, it is possible to determine rack cooling performance at the room level under essentially every cooler-failure scenario. In this discussion, a cooler-failure may be a failure of a cooler or any other cooling related equipment that reduces the effective cooling of a location by a specified quantity. Making a determination of rack cooling performance at the room level means considering cooler failures anywhere in the room as they affect the rack in question. Methods and apparatus embodying aspects of the invention simply test all cooler-failure scenarios for the room and keep track of the limiting number and type failures during which adequate cooling at a rack is nevertheless maintained. For example, if cooling performance of a rack remains adequate (adequate cooling performance being a CI above some minimum threshold) with any two coolers in the room "failed", the rack has "N+2" redundancy at the room level.

The CI only identifies situations where inadequate cooling at a rack arises due to airflow inadequacies. An additional constraint on adequate cooling performance that can be optionally applied is that all remaining functional coolers must have a cooling capacity capable of cooling the total heat load of the room during a failure scenario; if not, such a failure might be interpreted as a cooling failure at all rack locations. A similar additional, optional constraint is that the remaining functional coolers must have a cooling capacity capable of preventing localized hot spots resulting in a rack cooling failure due to effects other than inadequate air flow. These optional constraints can be applied in addition to the CI analysis, or can be, in some cases, built into the CI analysis by incorporating both the CI and temperature information into a more evolved index, or can be applied in any other suitable way. These additional constraints, however, represent unlikely failure modes under current design practices.

To save on calculations, a user-specified "target redundancy level" can be used. For example, if a user sets an "N+1" target cooling redundancy, once all single cooler failure scenarios have been tested and found to be "OK", the cooling redundancy is known to be "N+1" and multiple-cooler-failure scenarios need not be tested.

Embodiments according to aspects of the invention provide an estimate of the cooling reliability to an end user. Correct placement of cooling units may be difficult to guess due to the large deviations in local and room airflows that even slight adjustments can cause. Therefore, the exemplary tool will estimate a rack's cooling redundancy. The estimated redundancy will be a measure of the 'extra' cooling available. This additional cooling will perhaps permit one or more coolers to shut down or fail at a time and maintain full server operations. Thus, the redundancy may be defined differently depending on the metric used as defined in terms of the largest number of coolers that can be shut down, in any combination, while still operating equipment racks safely.

Cooling redundancy may be defined differently depending on scope. The higher levels of room and cluster redundancy can paint a general picture, while the rack-by-rack measure can pinpoint areas for improvement.

Rack Cooling Redundancy

Rack redundancies are the backbone of the tool. On a rack level, the cooling redundancy of a unit is a measure of its ability to handle either expected or unexpected shutdowns or failures of cooling units. There are a few cases:

A. "No coverage"—The current cluster configuration inadequately cools this rack.

B. "N"—The current cluster configuration adequately cools the rack, but the shutdown or failure of at least one cooling unit causes inadequate cooling.

C. "N+1"—The rack is adequately cooled in both the current configuration and under any single cooling unit shutdown or failure.

D. "N+j", where j is an integer greater than 1—The rack is adequately cooled, no matter what combination of j cooling units are shut down or fail.

Cluster Cooling Redundancy

For an overall cluster cooling redundancy, the redundancies of all racks in the cluster are examined to find the rack that has the least coverage. The coverage of that rack defines the overall cluster redundancy. Thus, a cluster has N+1 redundancy, if all racks are sufficiently cooled under any single cooling unit shutdown.

Room Cooling Redundancy

Similarly, the room has a cooling redundancy corresponding to that of the worst rack redundancy in the room.

Determination of Cooling Redundancy

As every other level depends on rack redundancy, each rack is examined, as illustrated in FIG. 3. In its simplest form, for a given rack, the method 300 of this embodiment checks each possible combination of cooler shutdowns, keeping track of the configurations when the rack is no longer adequately cooled 301, 303 and 305. The redundancy is then identified, 307, as one less than the smallest number of shutdown coolers for which the rack has insufficient cooling to remain at a safe operating temperature.

Method 300 can be performed in either of two ways, as may be desired. Method 300 can be performed for each rack location under consideration, for example in a room, as indicated above. According to this first alternative, the optional decision indicated at 302a is performed and the optional decision indicated at 302b is skipped. According to a second alternative, during each pass through method 300 described below, step 303 checks for adequate cooling at each rack location and step 305 records the results for each rack location checked. To perform this second alternative, the optional decision indicated at 302b is performed and the optional decision indicated at 302a is skipped.

In somewhat greater detail, if following the first alternative, the method 300 will perform the loop defined by the decision 302a for all racks. The method 300 performs a series of checks for all combinations of shut down coolers, 301. During each check, the method first checks the next untested combination to determine if a given rack has adequate cooling, 303. The combination checked and whether the cooling that results at the given rack will be inadequate is recorded, 305, for example in a computer memory or on a computer file. These checks are repeated, 301, 303, 305, until all combinations of shut down coolers are tested. Finally, the rack redundancy is identified as the number, less one, of coolers shut down in that combination having the smallest number of coolers shut down and which also has inadequate cooling, 307. Identification of the redundancy level, 307, can be done by searching the recorded information, by a process which sorts the data as the data is created and recorded, by a process which sorts the data after the data has been recorded, or by any other suitable process.

If following the second alternative, the method 300 enters a loop to perform a series of checks for all combinations of shut down coolers, 301. During each check, the method next enters a sub-loop to test all racks, as defined by the decision 302b. Within the sub-loop, the method first checks the next untested combination to determine if a given rack has adequate cooling, 303. The combination checked and whether the cooling that results at the given rack will be inadequate is recorded, 305, for example in a computer memory or on a computer file. These checks are repeated, 301, 302b, 303, 305, until all combinations of shut down coolers are tested for each rack. Finally, the rack redundancy is identified as the number, less one, of coolers shut down in that combination having the smallest number of coolers shut down and which also has inadequate cooling, 307. Identification of the redundancy level, 307, can be done by searching the recorded information, by a process which sorts the data as the data is created and recorded, by a process which sorts the data after the data has been recorded, or by any other suitable process.

Enumerating all of these combinations is computationally expensive for large numbers of racks and cooler, and for each combination enumerated, an algebraic computation (involving one or more algebraic steps) of the resulting CI is required. If n is the number of coolers, then there are $2^n$ combinations. For example, with two coolers, a first cooler and a second cooler, the $2^2=4$ failure modes are: neither cooler failed, only the first cooler failed, only the second cooler failed, and both coolers failed. Thus, further aspects keep the number of algebraic steps required to a minimum, at least by minimizing the number of combinations enumerated for each rack.

According to one aspect minimizing the computational load, once one rack is determined to have inadequate cooling, the redundancy is reported out as follows. The room level rack redundancy, as well as the redundancy of the rack determined to have inadequate cooling, is the number, less one, of coolers shut down at the point of failure. All remaining racks are reported to have the same or better redundancy, i.e., the same or larger redundancy values.

Figure 4:
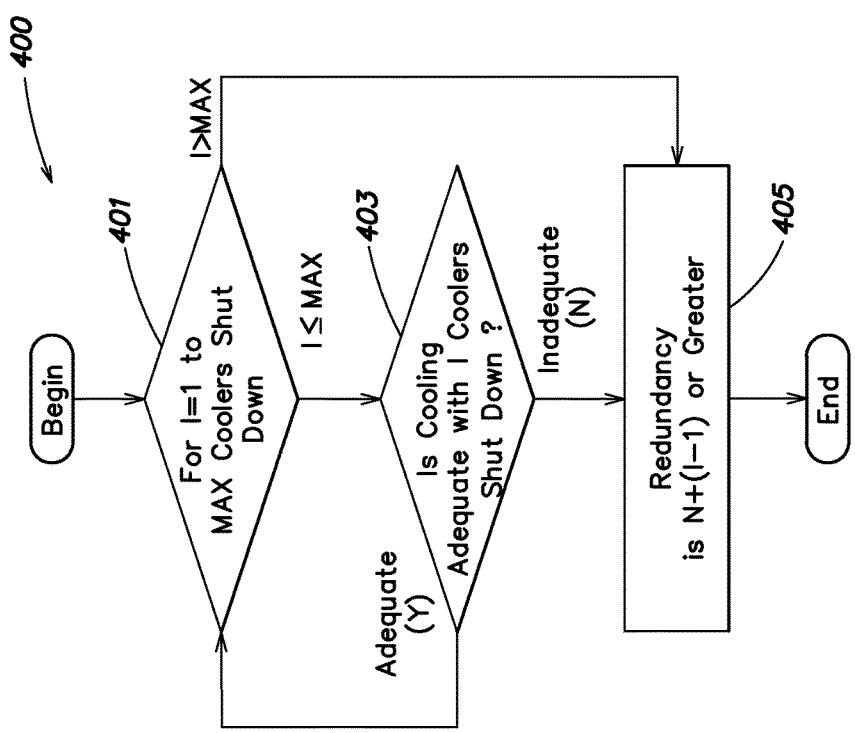
FIG. 4 depicts another example process for designing a data center configuration according to an embodiment.

As shown in FIG. 4, according to an embodiment of a more efficient method, 400, combinations are tested in a fixed order. First, all configurations with one shut down cooler are tested, followed by all double-cooler failure configurations, and so on. This logical ordering ensures that when a rack first fails to be adequately cooled, no additional configurations need be tested for that rack because, once a rack has failed at a given redundancy level, its redundancy level is known.

According to the method, 400, of this embodiment, an index, I, is incremented from 1 to a maximum possible number of shut down coolers, 401. If the index is less than the maximum, then the combinations having I coolers shut down are tested to determine if adequate cooling is available for all combinations of I coolers shut down, 403. The testing, 403, can proceed similarly to method 300, with the modification that all combinations of shut down coolers, 301, is limited to all combinations of I shut down coolers. If, during testing, 403, any combination of I coolers is found to produce inadequate cooling, then redundancy is identified to be N+(I−1), 405, according to standard redundancy notation. Testing is repeated for each incrementally larger index, I, value, up to the maximum, 401. If the maximum is reached, redundancy is identified as N+(I−1) or greater, 405.

Figure 5:
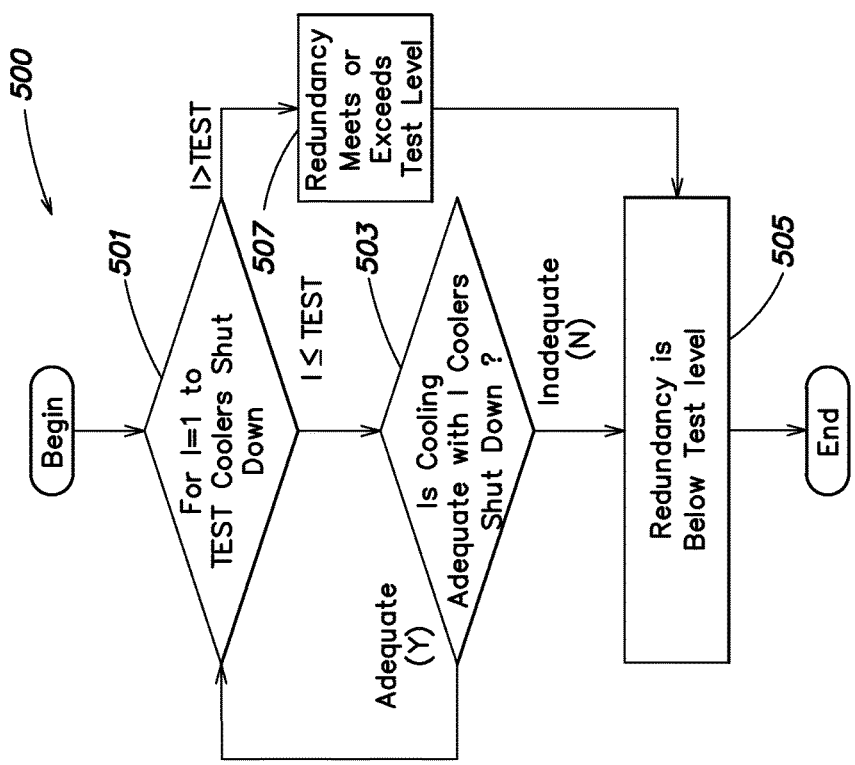
FIG. 5 shows another example process for designing a data center configuration according to an embodiment.

According to an embodiment of a method, 500, shown in FIG. 5, the user can specify a desired level of redundancy. Only shutdowns up to the specified level of redundancy need be tested. For example, if a user wants an N+1 redundancy then only all of the single cooling unit shutdowns need be tested. Setting the index, I, 501, and performing the tests, 503, proceed similarly to corresponding elements, 401, 403, of method 400. The maximum index in this method, 500, is simply a number of shut down coolers in a desired test level, 501. If any failure is detected, 503, redundancy is below the test level, 505; whereas, if no failure is detected, 503, and the test level is reached, 501, then redundancy meets or exceeds the test level, 507.

The foregoing aspects often reduce the computation complexity to only a handful of algebraic calculator calls, especially if the user sets a low level of desired redundancy.

Implementation

Implementation is now described in connection with an exemplary embodiment. Implementation may include two parts: establishing the user's desired level of redundancy in a user interface provided for the purpose of selecting desired room properties and output of the tool's results in an output view of a user interface displaying the resulting room airflow.

Room Properties

Figure 6:
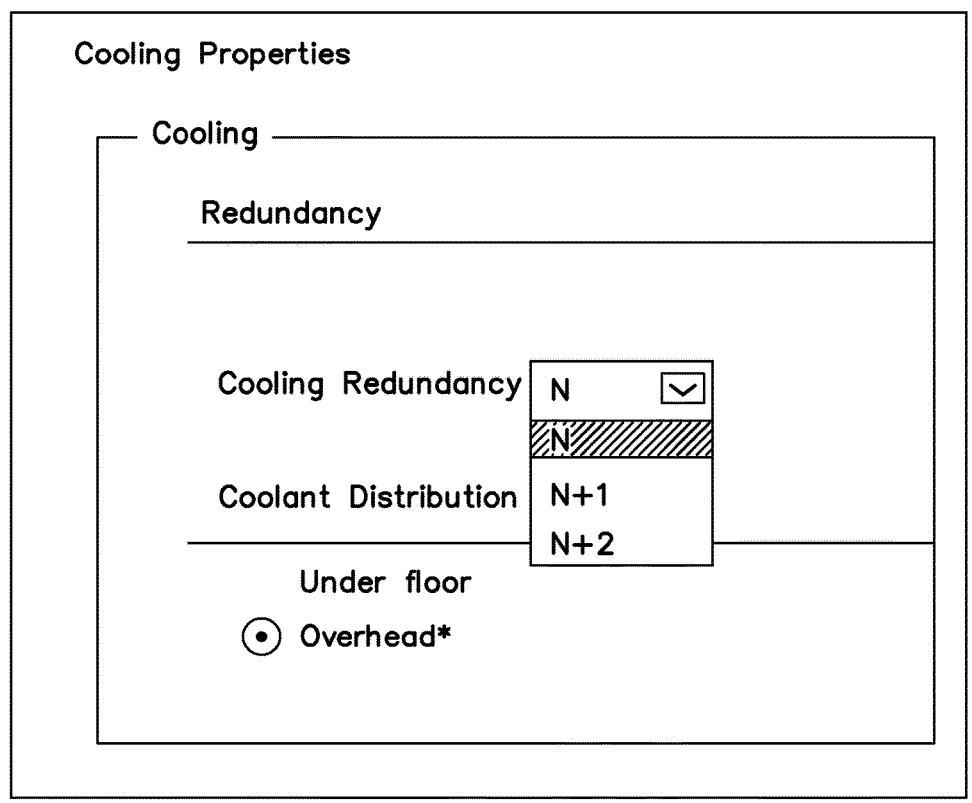
FIG. 6 shows an example interface through which a user may provide input to a data center model according to an embodiment.

According to one embodiment of a user interface, the cooling properties selections are displayed, as shown in FIG. 6. Among the parameters that a user can select is the desired cooling redundancy. The label next to the drop down list indicates "Desired cooling redundancy" and the user can select from the drop down list a desired cooling redundancy level to be tested for. A setting here does not guarantee a redundancy, just testing up to the user-specified level, as described in connection with FIG. 5.

The levels of redundancy, N, N+1, and N+2 shown are sufficient for most practical applications, but any level could be specified. Optionally, it is useful to suggest a redundancy level to the user based on any other inputs the user may have made that indicate the user's needs. A level of N+1 redundancy allows for adequate cooling under preventative maintenance or single cooler malfunctions. Redundancy at the N+2 level will mitigate a single cooler malfunction which occurs while preventive maintenance is being performed on another cooler, for example.

Airflow Room View

Figure 7:
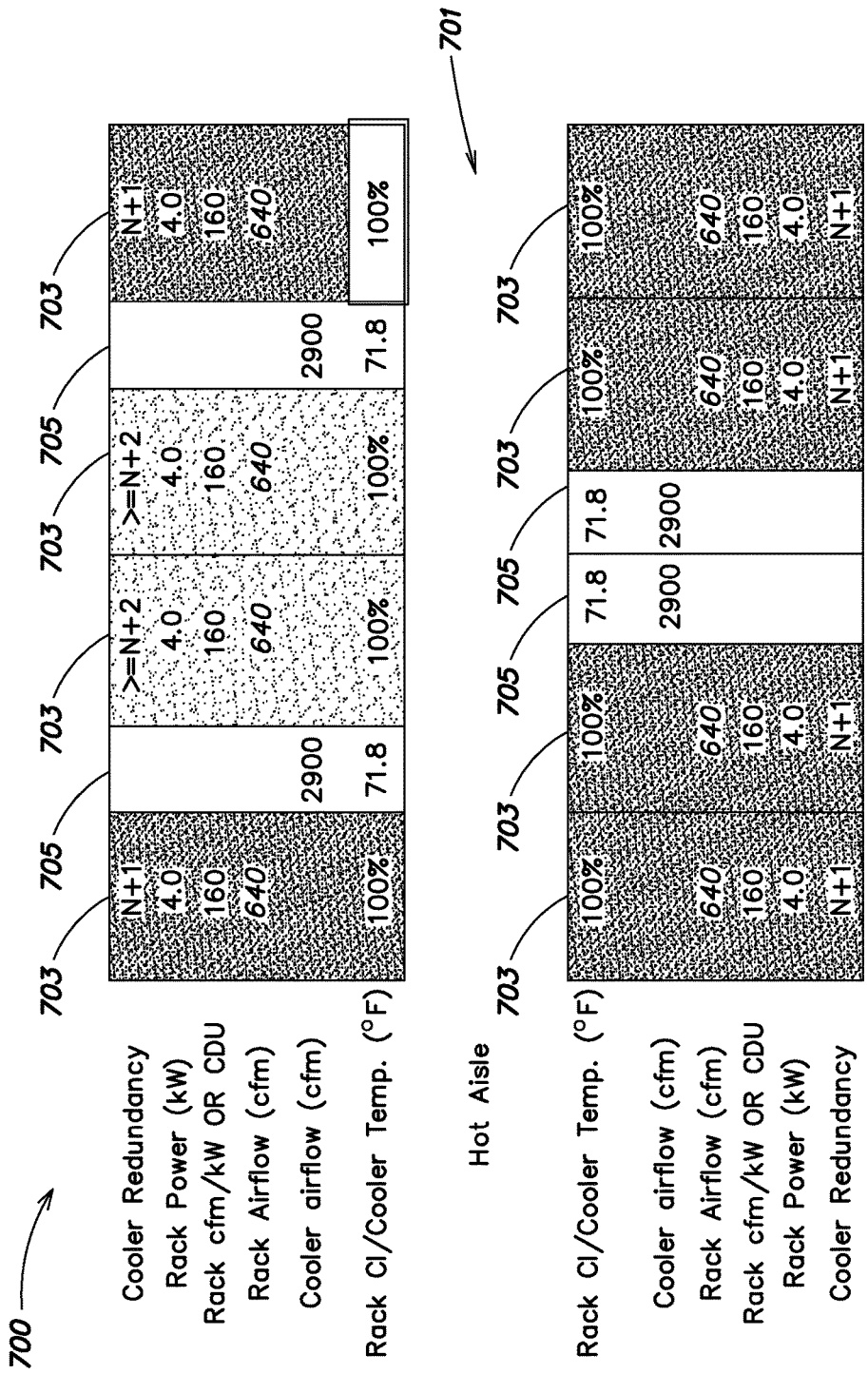
FIG. 7 shows an example interface through which a user may design a data center model according to an embodiment.

An embodiment of a user interface, 700, to display the results of a redundancy check is shown in FIG. 7.

The presentation of results of the redundancy check is kept efficient and uncluttered, so as to limit the clutter on the airflow view. An example of an airflow room view is shown in FIG. 7, where the desired redundancy is N+2. The interface, 700, includes a room layout, 701, showing the positions of racks, 703, and cooling equipment, 705, along with parameters related to each. The racks, 703, achieving the desired redundancy level are given one display characteristic, such as solid block color, while the racks with less than N+2 redundancies are given a different, distinguishing display characteristic, for example slightly grayed. The redundancy level achieved is also optionally indicated on the top of each rack, 703.

The actual redundancy calculations can optionally be displayed not on the airflow view, but in a mouse rollover. Then users can inspect racks further if they are grayed, particularly in embodiments which do not include the redundancy number on the rack image itself.

Coding

Preparing code for this tool is within the grasp of the skilled artisans upon reviewing the description, consisting essentially of user interface components, arrays and functions to test the different configurations and store the results.

One embodiment employs the following method to cycle through the combinations of on/off cooling units. The method is general enough to handle any number of coolers, but still test them in a particular order. As mentioned before, this ordering visits all combinations of one shutdown, then all combinations of two shutdowns, and so on.

The method is performed when seeking the next combination.

Algorithm Details

Let the leftmost cell of a vector of coolers be the "first" cell and the rightmost cell be the initial "last" cell, as shown in FIG. 8.

1. Starting from rightmost cell, examine the cell contents and move left until the first zero is located.
   a. If there are no zeroes in the vector, 801, load a zero into the leftmost cell, 802.
   b. Check whether the combination of coolers on (1's) and coolers off (0's) represented by the vector provides adequate cooling.
2. Check the cell to the right, 803, of the zero located, 802.
   a. If the cell checked contains a "1", swap the located "0" with the adjacent "1", effectively moving the located zero to the right, 804.
   b. Otherwise, if the last position located has been reached, perform the method on the remaining cells. Now, last=last−1.
3. If a number of zeros, for example M, are grouped at the end of the array, with all "1's" to the left, all shutdowns of the current (N+M) redundancy level have been checked. If the next level of redundancy is to be tested, move all M zeros to the leftmost positions, add another 0, 805, in the next available cell and repeat from 1, so that the configurations with M+1 shutdowns are tested.

This method ensures a smooth transition between the redundancy levels. It can be stopped as soon as a failure of cooling is detected.

Computing a CRI

As mentioned above, it is also possible to use the Cooling Reliability Index (CRI) in addition to or in lieu of the N+I-style metric. In this case, availability (percentage of uptime, e.g. 99.999%; or probability of availability, e.g. 0.99999) data for the cooling units is required. If this data is available, the various failure modes can be numerically simulated to determine the resulting aggregate availability of cooling at each rack location as a percentage of uptime (0-100%) or as a probability (0.0-1.0).

As above, each failure mode is simulated to assess whether cooling is adequate or not under the particular combination of failed coolers. In addition, the aggregate value, a, availability of adequate cooling for the rack location is computed from the combinations of coolers simulated and their individual availabilities. The aggregate value, "availability at each rack location," a, is then converted to a CRI number—a value between 0% and 100%.

This approach is more sophisticated than the N+I-style calculation because the actual cooler performance is taken into consideration. For example, if all coolers were 100% reliable the CRI of nearby racks (which have adequate primary cooling to begin with) would be 100% and it would be possible to meet any cooling availability goal without any redundant coolers.

While many functions can relate a value denoted CRI to availability of cooling at a rack location in a useful way, the following function defining CRI in terms of availability of cooling at a rack location, a, has been found to be particularly useful as a predictor of redundancy:

$$CRI = \begin{cases} \left(\frac{2}{3}\right)a & \text{for } a < 0.9 \\ -\frac{\log(1-a)}{10} + \frac{1}{2} & \text{for } 0.9 \leq a \leq 0.99999 \\ 1 & \text{for } a > 0.99999 \end{cases}.$$

This definition provides a convenient conversion of "the number of nines" in the decimal place of the availability, a, to an index which varies between 0 and 1. For example, a=0.9 is "one nine" and the corresponding CRI value is 0.6.

Similarly, "three nines" (a=0.999) is equivalent to CRI=0.8 and "five nines" (a=0.99999) is equivalent to CRI=100%. Thus in the range of a=0.9 to 0.99999, 0.1 is added to the cooling reliability index for every "additional nine" of availability.

Uses

Aspects of embodiments may be practiced, for example, to perform rack-by-rack redundancy calculations in any suitable data center design and management software.

Each of process 300, 400 and 500 depicts one particular sequence of acts in a particular embodiment. The acts included in each of these processes may be performed by, or using, one or more computer systems specially configured as discussed herein. Thus the acts may be conducted by external entities, such as users or separate computer systems, by internal elements of a system or by a combination of internal elements and external entities. Some acts are optional and, as such, may be omitted in accord with one or more embodiments. Additionally, the order of acts can be altered, or other acts can be added, without departing from the scope of the present invention. In at least some embodiments, the acts have direct, tangible and useful effects on one or more computer systems, such as storing data in a database or providing information to external entities.

Any references to front and back, left and right, top and bottom, and upper and lower are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements.

Any embodiment disclosed herein may be combined with any other embodiment, and references to "an embodiment," "some embodiments," "an alternate embodiment," "various embodiments," "one embodiment," "at least one embodiment," "this and other embodiments" or the like are not necessarily mutually exclusive and are intended to indicate that a particular feature, structure, or characteristic described in connection with the embodiment may be included in at least one embodiment. Such terms as used herein are not necessarily all referring to the same embodiment. Any embodiment may be combined with any other embodiment in any manner consistent with the aspects disclosed herein. References to "or" may be construed as inclusive so that any terms described using "or" may indicate any of a single, more than one, and all of the described terms.

Where technical features in the drawings, detailed description or any claim are followed by references signs, the reference signs have been included for the sole purpose of increasing the intelligibility of the drawings, detailed description, and claims. Accordingly, neither the reference signs nor their absence have any limiting effect on the scope of any claim elements.

Having now described some illustrative aspects of the invention, it should be apparent to those skilled in the art that the foregoing is merely illustrative and not limiting, having been presented by way of example only. Similarly, aspects of the present invention may be used to achieve other objectives including allowing users to design facilities other than data centers which may benefit from effective and efficient cooling systems. For example, according to one embodiment, users may design food preparation facilities, food storage facilities, manufacturing facilities and other facilities that may benefit from assured cooling redundancy levels. Numerous modifications and other illustrative embodiments are within the scope of one of ordinary skill in the art and are contemplated as falling within the scope of the invention. In particular, although many of the examples presented herein involve specific combinations of method acts or system elements, it should be understood that those acts and those elements may be combined in other ways to accomplish the same objectives.

What is claimed is:

1. A computer-implemented method of determining cooling redundancy information, comprising:
   modeling in a computer at least one location to be cooled by a plurality of coolers, wherein the at least one location includes at least one of an equipment rack, a cluster of equipment racks, and a room of equipment racks;
   iteratively modeling one or more cooler failure scenarios until a model of a cooler failure scenario of the one or more cooler failure scenarios indicates inadequate cooling at the at least one location, wherein iteratively modeling the one or more cooler failure scenarios includes calculating whether adequate cooling is available at the at least one location by calculating cooler failure scenarios from a least number of coolers shut down to a most number of coolers shut down and terminating the calculating of cooler failure scenarios and recording when a number of coolers shut down in a cooler failure scenario results in inadequate cooling, and wherein each cooler failure scenario of the one or more cooler failure scenarios includes at least one shut down cooler affecting the at least one location;
   recording information identifying each modeled cooler failure scenario along with whether each modeled cooler failure scenario results in adequate cooling;
   identifying the cooling redundancy information as one less than the number of coolers shut down in that modeled cooler failure scenario having the smallest number of coolers shut down and also having inadequate cooling available;
   computing an aggregate availability, a, of adequate cooling based on combinations of coolers included in each cooler failure scenario of the recorded information
   identifying the cooling redundancy information as a Cooling Redundancy Index (CRI), the CRI a function of the aggregate availability, a;
   calculating the cooling redundancy information as the CRI; and
   configuring data center equipment based on the CRI.

2. The method of claim 1, further comprising aggregating the identified cooling redundancy information at plural locations to determine cooling redundancy information for a site including the plural locations.

3. The method of claim 2, wherein aggregating further comprises selecting as the cooling redundancy information for the site, a smallest redundancy identified.

4. The method of claim 1, further comprising computing the CRI as $$CRI = \begin{cases} \left(\frac{2}{3}\right)a & \text{for } a < 0.9 \\ -\frac{\log(1-a)}{10} + \frac{1}{2} & \text{for } 0.9 \leq a \leq 0.99999 \\ 1 & \text{for } a > 0.99999 \end{cases}.$$

5. The method of claim 1, further comprising:
setting a desired test level of redundancy,
wherein iteratively modeling the one or more cooler failure scenarios includes iteratively modeling one or more cooler failure scenarios until either a model of a cooler failure scenario of the one or more cooler failure scenarios indicates inadequate cooling at the at least one location or the test level of redundancy is reached; and wherein identifying comprises identifying as the cooling redundancy information, whether the test level was reached.

6. The method of claim 1, further comprising iteratively performing the method at each of a plurality of locations in an environment.

7. The method of claim 1, further comprising iteratively modeling and recording at each of a plurality of locations in an environment.

8. A non-transitory computer readable medium having stored thereon sequences of instruction including instructions for determining cooling redundancy information that will cause a processor to:
model in a computer at least one location to be cooled by a plurality of coolers, wherein the at least one location includes at least one of an equipment rack, a cluster of equipment racks, and a room of equipment racks;
iteratively model one or more cooler failure scenarios until a model of a cooler failure scenario of the one or more cooler failure scenarios indicates inadequate cooling at the at least one location, wherein each model includes a calculation indicating whether adequate cooling is available at the at least one location by calculating cooler failure scenarios from a least number of coolers shut down to a most number of coolers shut down and to terminate the calculating and recording when a number of coolers shut down in a cooler failure scenario results in inadequate cooling, and wherein each cooler failure scenario of the one or more cooler failure scenarios includes at least one shut down cooler affecting the at least one location;
record information identifying each modeled cooler failure scenario along with whether each modeled cooler failure scenario results in adequate cooling;
identify the cooling redundancy information as one less than the number of coolers shut down in that modeled cooler failure scenario having the smallest number of coolers shut down and also having inadequate cooling available;
compute an aggregate availability, a, of adequate cooling based on combinations of coolers included in each cooler failure scenario of the recorded information; and
identify the cooling redundancy information as a Cooling Redundancy Index (CRI), the CRI a function of the aggregate availability, a;
calculate the cooling redundancy information as the CRI; and
configure data center equipment based on the CRI.

9. The non-transitory computer readable medium of claim 8, further having stored thereon sequences of instruction including instructions that will cause a processor to aggregate the identified cooling redundancy information at plural locations to determine cooling redundancy information for a site including the plural locations.

10. The non-transitory computer readable medium of claim 9, wherein aggregating the identified cooling redundancy at plural locations further comprises selecting as the cooling redundancy information for the site, a smallest redundancy identified.

11. The non-transitory computer readable medium of claim 8, further having stored thereon sequences of instruction including instructions that will cause a processor to compute the CRI as $$CRI = \begin{cases} \left(\frac{2}{3}\right)a & \text{for } a < 0.9 \\ -\frac{\log(1-a)}{10} + \frac{1}{2} & \text{for } 0.9 \leq a \leq 0.99999 \\ 1 & \text{for } a > 0.99999 \end{cases}.$$

12. The non-transitory computer readable medium of claim 8, further having stored thereon sequences of instruction including instructions that will cause a processor to:
set a desired test level of redundancy,
wherein to iteratively model one or more cooler failure scenarios includes iteratively modeling one or more cooler failure scenarios until either a model of a cooler failure scenario of the one or more cooler failure scenarios indicates inadequate cooling at the at least one location or the test level of redundancy is reached, wherein identifying comprises identifying as the cooling redundancy information, whether the test level was reached.

13. The non-transitory computer readable medium of claim 8, further having stored thereon sequences of instruction including instructions that will cause a processor to iteratively perform the method at each of a plurality of locations in an environment.

14. The non-transitory computer readable medium of claim 8, further having stored thereon sequences of instruction including instructions that will cause a processor to iteratively model and record at each of a plurality of locations in an environment.

15. A system for determining cooling redundancy information, comprising:
a computer memory holding a data structure model of at least one location cooled by a plurality of coolers, wherein the at least one location includes at least one of an equipment rack, a cluster of equipment racks, and a room of equipment racks;
a display through which a user views a representation of the model; and
a computer processor which accesses the computer memory and which further executes a sequence of instructions which cause the processor to:
iteratively model one or more cooler failure scenarios until a model of a cooler failure scenario of the one or more cooler failure scenarios indicates inadequate cooling at the at least one location, wherein each model includes a calculation indicating whether adequate cooling is available at the at least one location by calculating cooler failure scenarios from a least number of coolers shut down to a most number of coolers shut down and terminating the calculating and recording when a number of coolers shut down in a cooler failure scenario results in inadequate cooling, and wherein each cooler failure scenario of the one or more cooler failure scenarios includes at least one shut down cooler affecting the at least one location;
record in at least one computer memory location information identifying each modeled cooler failure scenario along with whether each modeled cooler failure scenario results in adequate cooling;

identify the cooling redundancy information as one less than the number of coolers shut down in that modeled cooler failure scenario having the smallest number of coolers shut down and also having inadequate cooling available;

compute an aggregate availability, a, of adequate cooling based on combinations of coolers included in each cooler failure scenario of the recorded information;

identify the cooling redundancy information as a Cooling Redundancy Index (CRI), the CRI a function of the aggregate availability, a;

calculate the cooling redundancy information as the CRI;

display to a user the identified cooling redundancy information; and configure data center equipment based on the CRI.

16. The system of claim 15, wherein the sequence of instructions further comprise aggregating the identified cooling redundancy information at plural locations to determine cooling redundancy information for a site including the plural locations.

17. The system of claim 16, wherein aggregating further comprises selecting as the cooling redundancy information for the site, a smallest redundancy identified.

18. The system of claim 15, wherein the sequence of instructions further comprise computing the CRI as $$CRI = \begin{cases} \left(\frac{2}{3}\right)a & \text{for } a < 0.9 \\ -\frac{\log(1-a)}{10} + \frac{1}{2} & \text{for } 0.9 \leq a \leq 0.99999 \\ 1 & \text{for } a > 0.99999 \end{cases}.$$

19. The system of claim 15, further comprising:
setting a desired test level of redundancy,
wherein iteratively modeling the one or more cooler failure scenarios includes iteratively modeling one or more cooler failure scenarios until either a model of a cooler failure scenario of the one or more cooler failure scenarios indicates inadequate cooling at the at least one location or the test level of redundancy is reached; and wherein identifying comprises identifying as the cooling redundancy information, whether the test level was reached.

20. The system of claim 15, wherein the sequence of instructions further comprise iteratively performing the sequence of instructions at each of a plurality of locations in an environment.

21. The system of claim 15, wherein the sequence of instructions further comprise iteratively modeling and recording at each of a plurality of locations in an environment.

* * * * *